United States Patent [19]

Kondo

[11] Patent Number: 5,109,257

[45] Date of Patent: Apr. 28, 1992

[54] TESTING CIRCUIT FOR SEMICONDUCTOR MEMORY ARRAY

[75] Inventor: Ichiro Kondo, Tokyo, Japan

[73] Assignee: NEC Corporation, Tokyo, Japan

[21] Appl. No.: 456,676

[22] Filed: Dec. 27, 1989

[30] Foreign Application Priority Data

Dec. 27, 1988 [JP] Japan .................... 63-331707

[51] Int. Cl.$^5$ .......................................... H01L 29/68
[52] U.S. Cl. ..................... 357/23.5; 357/23.14; 357/45; 365/201; 324/523
[58] Field of Search ............... 365/201, 185; 357/23.5, 357/45, 23.14; 355/201, 185; 324/523

[56] References Cited

U.S. PATENT DOCUMENTS

| | | | |
|---|---|---|---|
| 4,841,482 | 6/1989 | Kreifels et al. | 365/185 |
| 4,860,259 | 8/1989 | Tobita | 365/201 |
| 4,870,618 | 9/1989 | Iwashita | 365/201 |
| 4,956,816 | 9/1990 | Atsumi et al. | 365/201 |

*Primary Examiner*—William Mintel
*Assistant Examiner*—Roy Potter
*Attorney, Agent, or Firm*—Helfgott & Karas

[57] ABSTRACT

A test circuit is incorporated in a semiconductor memory device including at least one ultraviolet erasable and electrically programmable non-volatile memory cell having a control gate and a floating gate. The test circuit comprises a switching circuit for selectively supplying the control gate of the memory cell with a voltage which is higher than a power supply voltage for ordinary reading a content of the memory cell, through a write voltage supply line used for writing data to the memory cell. The switching circuit makes it possible to test the written state of the memory cell with a voltage different from the normal reading power supply voltage.

6 Claims, 6 Drawing Sheets

TESTING CIRCUIT FOR SEMICONDUCTOR MEMORY ARRAY

BACKGROUND OF THE INVENTION

1. Field of the Invention

The present invention relates to a semiconductor integrated circuit, and more specifically to a test circuit for an ultraviolet erasable and electrically programmable non-volatile semiconductor memory.

2. Description of Related Art

At present, an electrically programmable non-volatile semiconductor memory (called "EPROM" in this specification) has been widely used. FIG. 1 shows a diagrammatic sectional view of a typical EPROM cell.

The shown EPROM cell includes a p-type semiconductor substrate 10 and a source diffused region 12 and a drain diffused region 14 formed on a principal surface of the substrate 10 separately from each other. On the principal surface of the substrate 10 between the source diffused region 12 and the drain diffused region 14, a first gate oxide 16 is formed, and then, a floating gate 18 formed of for example a polycrystalline silicon is located on the first gate oxide 16. Furthermore, a second gate oxide 20 is provided on the floating gate 18, and a control gate 22 formed of for example a polycrystalline silicon is formed on the second gate oxide 20. Therefore, the floating gate 18 is surrounded by insulators. In addition, a source electrode 24 and a drain electrode 26 are provided in contact to the source diffused region 12 and the drain diffused region 14, respectively.

In the EPROM as mentioned above, if a sufficient amount of ultraviolet light is irradiated, the EPROM is brought into an erased state in which no electric charge is accumulated at the floating gate 18. On the other hand, the EPROM cell can be put into a written state in which a number of electrons are accumulated at the floating gate 18, by applying a high voltage between the drain diffused region 14 and the control gate 22 to cause hot electrons to generate in proximity of the drain diffused region 14 and the generated hot electrons to be injected into the floating gate 18 by action of the voltage of the control gate 22. The erased state and the written state correspond to two different values in a binary notation.

The EPROM cell assume either of two characteristics shown in FIG. 2, dependently upon whether or not the electrons are accumulated in the floating gate. In FIG. 2, the axis of abscissa represents a control gate voltage, and the axis of ordinate shows a drain current flowing through the EPROM cell. As seen from FIG. 2, a threshold of the EPROM cell is low in the erased state and high in the written state. Therefore, the state of the EPROM cell can be electrically detected by applying a voltage higher than the threshold of the erased state but lower than the threshold of the written state and checking whether or not the drain current flows through the EPROM cell. This detection is ordinarily performed by a detection circuit called a "sense amplifier". Namely, data stored in the EPROM cell is read by the sense amplifier.

In general, a voltage applied to the control gate for data reading is the same as a voltage of a power supply. Therefore, if a different between the voltage applied to the control gate for data reading and the threshold voltage of the written state is not sufficient, an electric charge accumulated in the floating gate in the written state is gradually leaked out of the floating gate in use of a long term, and ultimately, a correct memory content is lost. Therefore, the EPROM is required to have a sufficient high threshold in the written state, and a sufficient insulating property of the insulator surrounding the floating gate 18 to prevent the electrons from being leaked out of the floating gate.

In other words, it is a current practice to sort or pick up only EPROMs having the above mentioned property, after the EPROMs have been manufactured. One typical picking-up method includes the steps of irradiating a sufficient amount of ultraviolet light after completion of wafer process so as to bring EPROMs in the erased state; reading the content of the EPROMs so as to confirm that the EPROMs are in the erased state; and thereafter, writing the EPROMs so as to put the EPROMs in the written state; and reading the EPROMs by applying a voltage higher than an ordinarily used power supply voltage, to the control gate of the EPROM cell, thereby examining the threshold voltage of the written state by means of a sense amplifier. The above mentioned test method for examining the written state of the EPROMs by changing the voltage of the power supply, is well known by a report "TEST ON RELIABILITY OF EPROM LSI", Japanese Electronic Parts Reliability Center.

After the EPROMs having the electrons accumulated in the floating gate are retained at a high temperature in the range of 125° C. to 250° C. for a period of time of one hour to 24 hours, the above mentioned test for reading the content of the EPROMs by applying a voltage higher than the power supply voltage is performed. As a result, it could be known that the threshold voltage of the written state has dropped. Namely, it is possible to remove the EPROMs in which the electrons accumulated in the floating gate has decreased as the result of the high temperature storage.

Another testing method is to set the threshold of the written state at a low level and to perform the pick-up operation by applying a not-so-high power supply voltage. The setting of the threshold of the written state at a low level can be realized by lowering the power supply voltage for writing.

Referring to FIG. 3, there is shown a block diagram of a conventional EPROM device. The shown EPROM device includes a memory cell array 30, a row decoder 32 having a plurality of output lines 34 coupled to the memory cell array 30, and a column decoder 36 having a plurality of output lines 38 coupled to a column selection circuit 40 associated to the memory array 30. The column selection circuit 40 is coupled to a read/write circuit 42. In addition, the output lines 34 of the row decoder 32 are connected to a row decoder high voltage switching circuit 44, which serves to supply a writing high voltage to a selected one of the output lines 34 of the row decoder 32. The output lines 38 of the column decoder 36 are connected to a column decoder high voltage switching circuit 46, which serves to supply a writing high voltage to a selected one of the output lines 38 of the column decoder 36.

A normal power supply voltage is supplied to the row decoder 32, the column decoder 34 and the read/write circuit 42. A first write voltage WRITE VOLTAGE 1 is supplied to the row decoder high voltage switching circuit 44, and a second write voltage WRITE VOLTAGE 2 is supplied to the column decoder high voltage switching circuit 46 and the read/- write circuit 42. A third write voltage WRITE VOLTAGE 3 is supplied to the read/write circuit 42.

The normal power supply voltage and the first to third write voltages are determined on the basis of the characteristics of memory cells and a circuit construction of the EPROM device. Currently available EPROMs are such that 5 V is supplied as the normal power supply voltage from an external terminal, and 12.5 V or 21.0 V is supplied as a write voltage from an external terminal. Therefore, the first write voltage WRITE VOLTAGE 1, the second write voltage WRITE VOLTAGE 2 and the third write voltage WRITE VOLTAGE 3 are generated by voltage-converting the external write voltage of 12.5 V or 21.0 V.

In the above mentioned EPROM device, when the EPROM is written, the first write voltage WRITE VOLTAGE 1, the second write voltage WRITE VOLTAGE 2 and the third write voltage WRITE VOLTAGE 3 are used, and when the EPROM memory is read out, only the normal voltage is used. In other words, the above mentioned EPROM device cannot use a voltage sufficiently higher than the normal power supply voltage, as the normal power supply voltage for examining the change of the threshold of the EPROM while changing the power supply voltage in order to remove defects of EPROMs after the completion of wafer process.

On the other hand, variation or dispersion in manufacturing cannot be avoided in integrated circuits. Therefore, the threshold of the written state will inevitably change due to variation of a writing characteristics. In addition, the amount of change of the threshold after the high temperature storage will inevitably change due to variation of the thickness of the oxide layer surrounding the floating gate. Therefore, it is not possible to examine the written state threshold of an EPROM which has a threshold which is relatively high just after it is written and which relatively greatly drops after the high temperature storage but is still higher than the power supply voltage used for the above mentioned testing. In other words, it is not possible to sufficiently detecting the change of the written state threshold after the high temperature storage in the process of the screening. As a result, it is not possible to completely reject or eliminate defective EPROMs.

SUMMARY OF THE INVENTION

Accordingly, it is an object of the present invention to provide a semiconductor integrated circuit which has overcome the above mentioned defect of the conventional one.

Another object of the present invention is to provide a semiconductor integrated circuit which allows to test a written state threshold by a voltage different from a normal power supply voltage.

The above and other objects of the present invention are achieved in accordance with the present invention by a test circuit incorporated in a semiconductor memory device which includes at least one ultraviolet erasable and electrically programmable non-volatile memory cell having a control gate and a floating gate, comprising means for selectively supplying the control gate of the memory cell with a voltage which is higher than a power supply voltage used for ordinarily reading a content of the memory cell, and which is supplied through a write voltage supply line used for writing data to the memory cell.

Differently from the conventional EPROM testing method supplying a power supply voltage to a control gate of the ultraviolet erasable and electrically programmable non-volatile memory cell in order to examine the written state threshold, the semiconductor memory device in accordance with the present invention has means for selectively supplying the control gate of the memory cell with a voltage which is higher than a power supply voltage used for ordinarily reading a content of the memory cell. Therefore, at the time of testing, if the high voltage is applied to the control gate of the memory cell, the written state threshold can be examined by the voltage higher than a normal power supply voltage.

The above and other objects, features and advantages of the present invention will be apparent from the following description of preferred embodiments of the invention with reference to the accompanying drawings.

DESCRIPTION OF THE PREFERRED EMBODIMENTS

Figure 4:
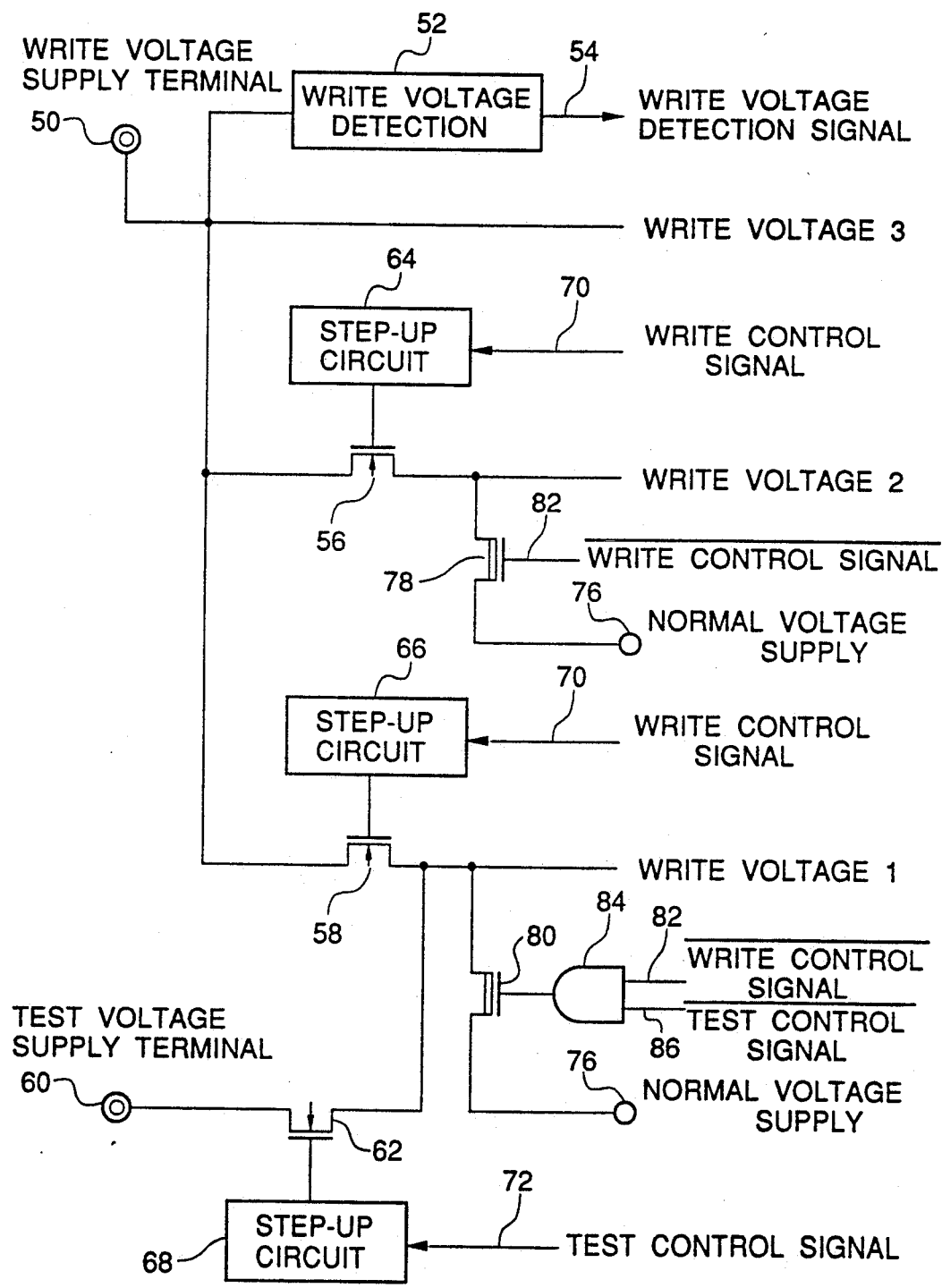
FIG. 4 is a logic diagram of a first embodiment of the test circuit in accordance with the present invention for use in an ultraviolet erasable and electrically programmable non-volatile semiconductor memory.

Referring to FIG. 4, there is shown a logic diagram of a first embodiment of the test circuit in accordance with the present invention for use in an ultraviolet erasable and electrically programmable non-volatile semiconductor memory.

The shown test circuit has a write voltage terminal 50 to be connected to receive a voltage used for writing, for example 12.5 V or 21.0 V. This write voltage terminal 50 is connected to a write voltage detection circuit 52, which operates to detect whether or not the write voltage is actually supplied to the write voltage terminal 50 and to generate a write voltage detection signal 54 of a high level when a voltage on the write voltage terminal 50 is higher than a normal power supply voltage used for reading.

Figure 1:
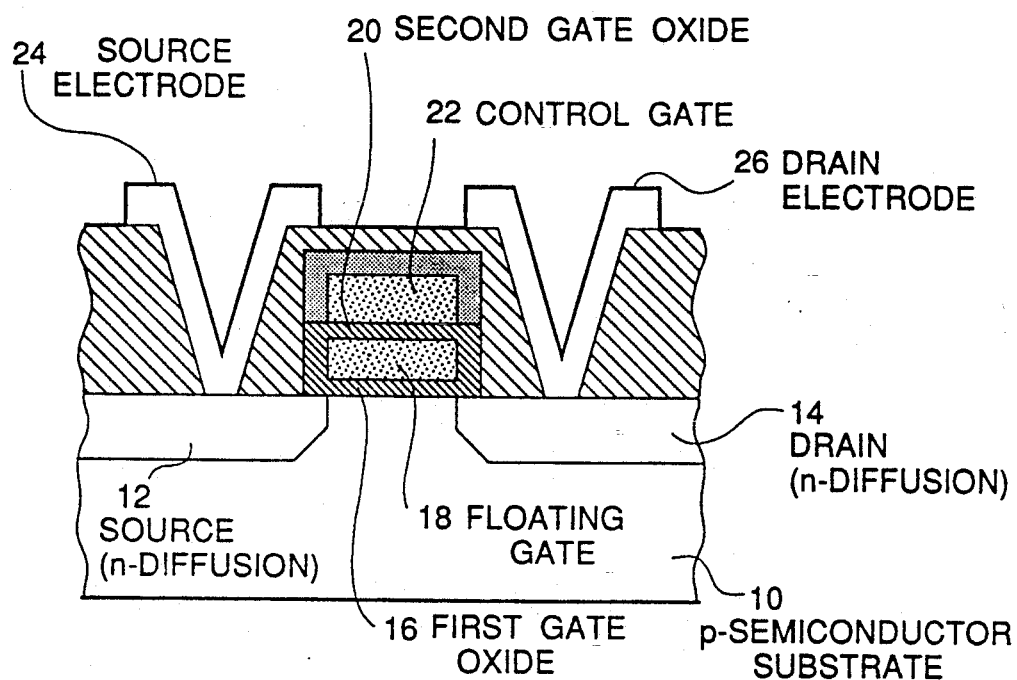
FIG. 1 shows a diagrammatic sectional view of a typical EPROM cell.
Figure 2:
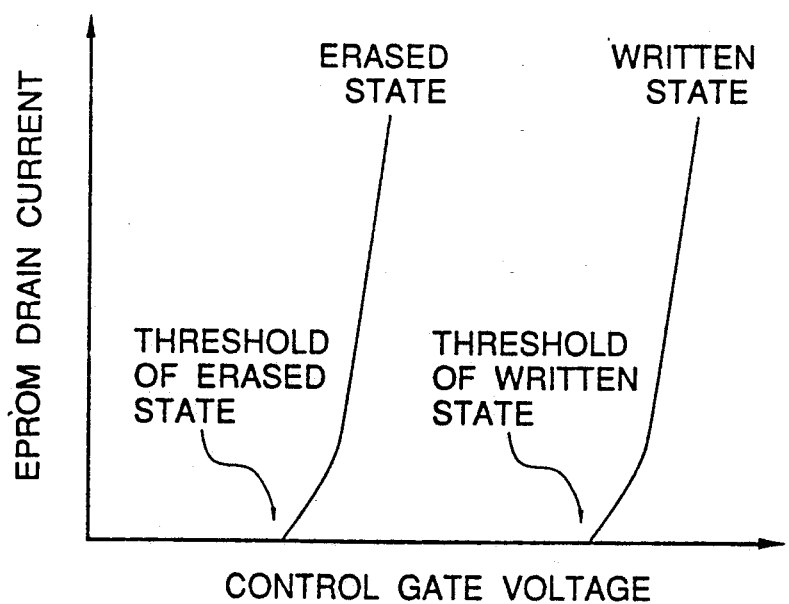
FIG. 2 is a graph illustrating a relation between a control gate voltage and a drain current of the EPROM cell, dependently upon whether or not the electrons are accumulated in the floating gate.
Figure 3:
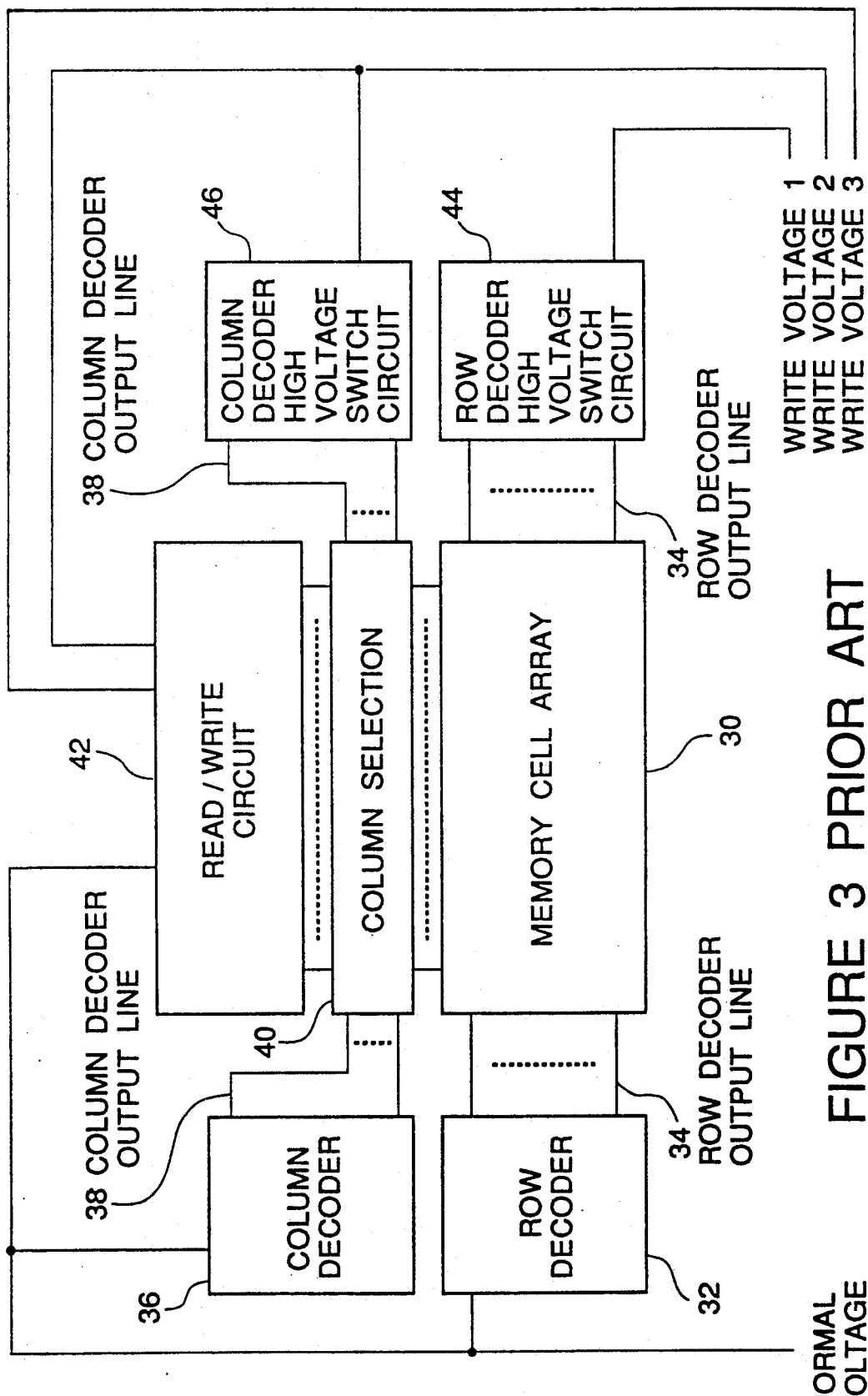
FIG. 3 is a block diagram of a conventional EPROM device.

The voltage supplied to the write voltage terminal 50 is outputted as the third write voltage WRITE VOLTAGE 3 as shown in FIG. 3, and also outputted through switching transistors 56 and 58 as the second and first write voltages WRITE VOLTAGE 2 and WRITE VOLTAGE 1 as shown in FIG. 3.

The test circuit also includes a test voltage supply terminal 60 to be connected to receive a test voltage to be applied to a control gate of the memory cell at the time of testing the memory cell. The test voltage supply terminal 60 is connected through a switching transistor 62 to the terminal WRITE VOLTAGE 1. Gates of the switching transistors 56, 58 and 62 are connected to outputs of step-up circuits 64, 66 and 68, respectively.

In the shown test circuit, the switching transistors 56, 58 and 62 are of the N-channel field effect transistor, and therefore, unless a gate voltage of each of the N-channel switching transistors 56, 58 and 62 is made higher than the write voltage by at least a threshold of the N-channel transistor because of a backgate effect, the write voltage on the write voltage terminal 50 cannot be supplied to an internal circuit as the first, second and third write voltages WRITE VOLTAGE 1, WRITE VOLTAGE 2 and WRITE VOLTAGE 3. For this reason, the step-up circuits 64, 66 and 68 are provided.

The step-up circuit 64 and 66 are connected to receive a write control signal 70, respectively. The step-up circuit 68 is connected to receive a test control signal 72.

Furthermore, the terminals WRITE VOLTAGE 2 and WRITE VOLTAGE 1 are connected to a normal voltage supply terminal 76 through N-channel depletion transistors 78 and 80, respectively. A gate of the N-channel depletion transistor 78 is connected to receive a signal 82 complementary to the write control signal 70. In addition, a gate of the N-channel depletion transistor 80 is connected to an output of an AND gate 84 having a first input connected to receive the inverted write control signal 82 and a second input connected to receive a signal 86 complementary to the test control signal 72.

Now, a write operation will be described. For example, 12.5 V is supplied to the write voltage supply terminal 50. The write voltage detection circuit 52 detects the voltage of 12.5 V and generates the high level write voltage detection signal 54. On the other hand, if a write signal is applied, the write control signal 70 and its complementary signal 82 are brought to a high level and a low level, respectively. At this time, the test control signal 72 and its complementary signal 86 are at a low level and a high level, respectively. As a result, the step-up circuits 64 and 66 respectively supply the gate of the associated switching transistors 56 and 58 with a voltage higher than the write voltage supply voltage, and the step-up circuit 68 outputs a low level signal to the associated switching transistor 62. Therefore, a write voltage near to 12.5 V is supplied to the terminals WRITE VOLTAGE 2 and WRITE VOLTAGE 1 through the transistors 56 and 58, respectively, and on the other hand, the N-channel depletion transistors 78 and 80 are rendered non-conductive. Furthermore, the write voltage supply voltage of 12.5 V is supplied to the terminal WRITE VOLTAGE 3.

Next, a test operation will be described. 12.5 V is supplied to the write voltage supply terminal 50, and therefore, the write voltage detection circuit 52 generates the high level write voltage detection signal 54. On the other hand, the test control signal 72 and its complementary signal 86 are brought to a high level and a low level, respectively. The write control signal 70 and its complementary signal 82 are at a low level and a high level, respectively. Therefore, the step-up circuit 68 supplies the gate of the associated switching transistor 62 with a voltage higher than the write voltage supply voltage, and the step-up circuits 64 and 68 output a low level signal to the associated switching transistors 56 and 58. Furthermore, the N-channel depletion transistor 80 is non-conductive, and the N-channel depletion transistor 78 is rendered conductive. Therefore, a voltage near to the test voltage on the terminal 60 is supplied to the terminal WRITE VOLTAGE 1 through the transistor 62, and the normal power supply voltage is supplied to the terminal WRITE VOLTAGE 2 through the trasistor 78. Furthermore, the write voltage supply voltage of 12.5 V is supplied to the terminal WRITE VOLTAGE 3.

As seen from the block diagram shown in FIG. 3, the EPROM device is so designed that the voltage on the terminal WRITE VOLTAGE 3 can be applied to the control gate of the memory cell. In other words, it is possible to change the voltage applied to the control gate of the memory cell, independently of the normal power supply voltage. In addition, the range of changing the voltage applied to the control gate of the memory cell can be extended near to the write voltage supply voltage. Therefore, by changing the test voltage supply voltage, it is possible to sufficiently examine the written state threshold of the memory cell.

Recently, a microprocessor having an EPROM in place of a mask ROM for a program has been used as a program development system. In this case, it is required that the mask ROM and the EPROM have the same pin location of package, so that the program mask ROM is replaced by the EPROM. On the other hand, the EPROM is required to have a write voltage terminal in addition to those for the mask ROM. Therefore, it is required to use as the write voltage terminal a terminal which is not used at the time of writing the EPROM.

In the shown embodiment, when the write voltage is not supplied to the terminal 50, the write voltage detection signal 54 is at a low level. Therefore, the test circuit is modified to the effect that the write voltage detection signal 54 is supplied to the step-up circuits 64, 66 and 68, and these step-up circuits bring their outputs to a low level when the write voltage detection signal 54 is at a low level, so that all of the switching transistors 56, 58 and 62 are rendered non-conductive. With this modification, when the EPROM is not written, the write voltage supply terminal 50 and the test voltage terminal 60 can be used for another function.

Figure 5:
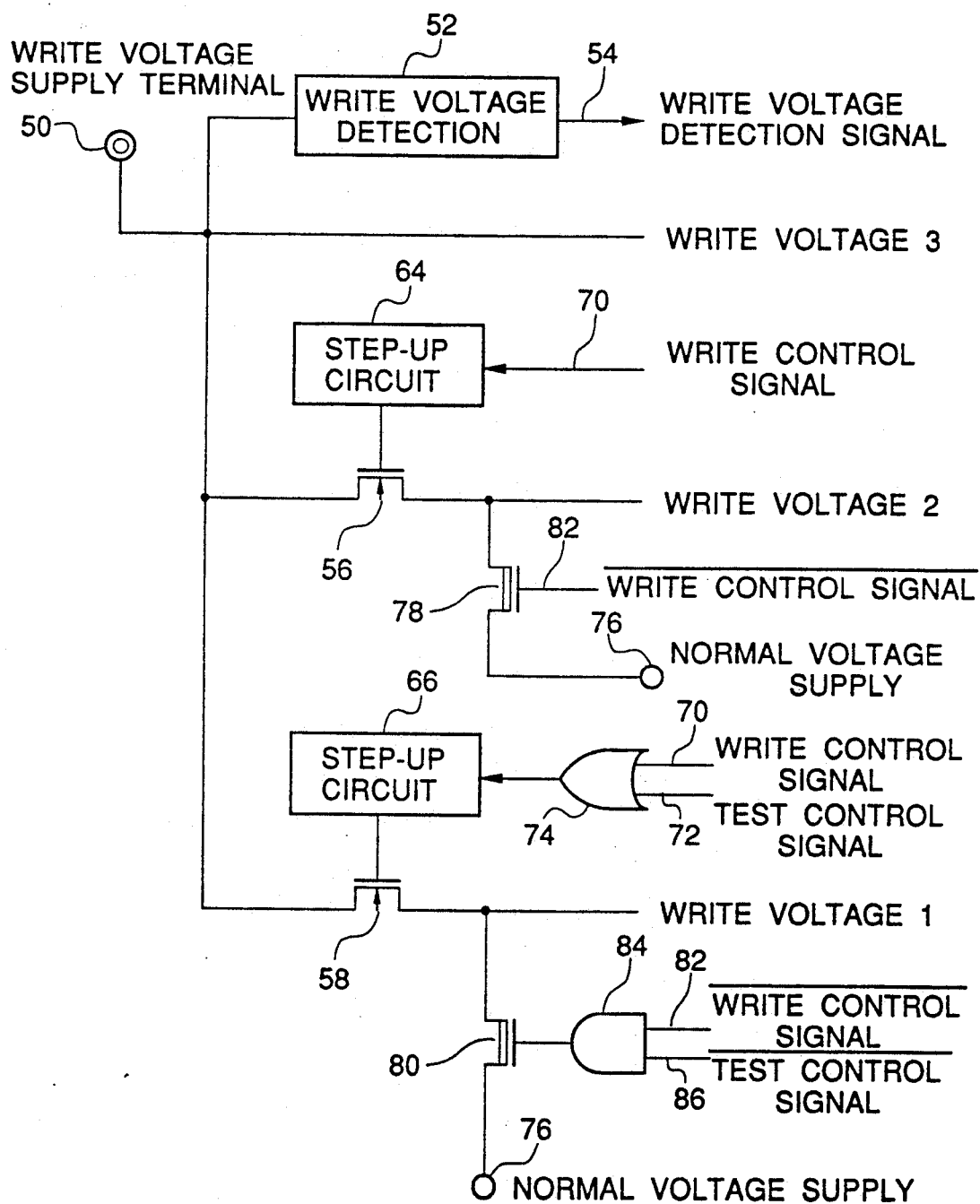
FIG. 5 is a logic diagram of a second embodiment of the test circuit in accordance with the present invention for use in an ultraviolet erasable and electrically programmable non-volatile semiconductor memory.

Referring to FIG. 5, there is a logic diagram of a second embodiment of the test circuit in accordance with the present invention for use in an ultraviolet erasable and electrically programmable non-volatile semiconductor memory. In FIG. 5, elements similar or corresponding to those shown in FIG. 4 are given the same reference numerals, and an explanation thereof will be omitted.

As seen from comparison between FIGS. 4 and 5, the second embodiment shown in FIG. 5 does not have the test voltage supply terminal 60, the switching transistor 62 and the step-up circuit 68. On the other hand, the step-up circuit 66 is connected to receive the write control signal 70 and the test control signal 72 through an OR gate 74.

Therefore, the second embodiment shown in FIG. 5 is characterized in that the test voltage is made equal to the write voltage supply voltage. The test circuit having this feature is very advantageous in microprocessors having a small number of terminals or input terminals, since a terminal that can be mainly used as the write voltage terminal is generally an input terminal.

Now, a testing operation of the second embodiment will be explained. When the test control signal 72 is brought to the high level, the step-up circuit 66 is activated to turn on the switching transistor 58, so that the write voltage is supplied to the terminal WRITE VOLTAGE 1. Accordingly, it is possible to examine the written state threshold by reading the EPROM cell while supplying the write voltage supply voltage to the control gate of the memory cell.

In the second embodiment, the voltage applied to the control gate of the EPROM cell is independent of the normal power supply voltage, but is not independent of the write voltage. However, it should be noted that since the memory cell is read out at the time of testing, the write voltage supply voltage supplied to the terminal 50 is not required to be at 12.5 V, and it is sufficient if the write voltage supply voltage supplied to the terminal 50 is higher than a level detected by the write voltage detection circuit 52. On the other hand, the detection level of the write voltage detection circuit 52 can be set at a level which is higher than the normal power supply voltage by 1.5 V to 2.0 V. Therefore, assuming that the normal power supply voltage is of 5 V, it is possible to change the write voltage in a range exceeding 7 V. This is sufficient to test the written state threshold.

Figure 6:
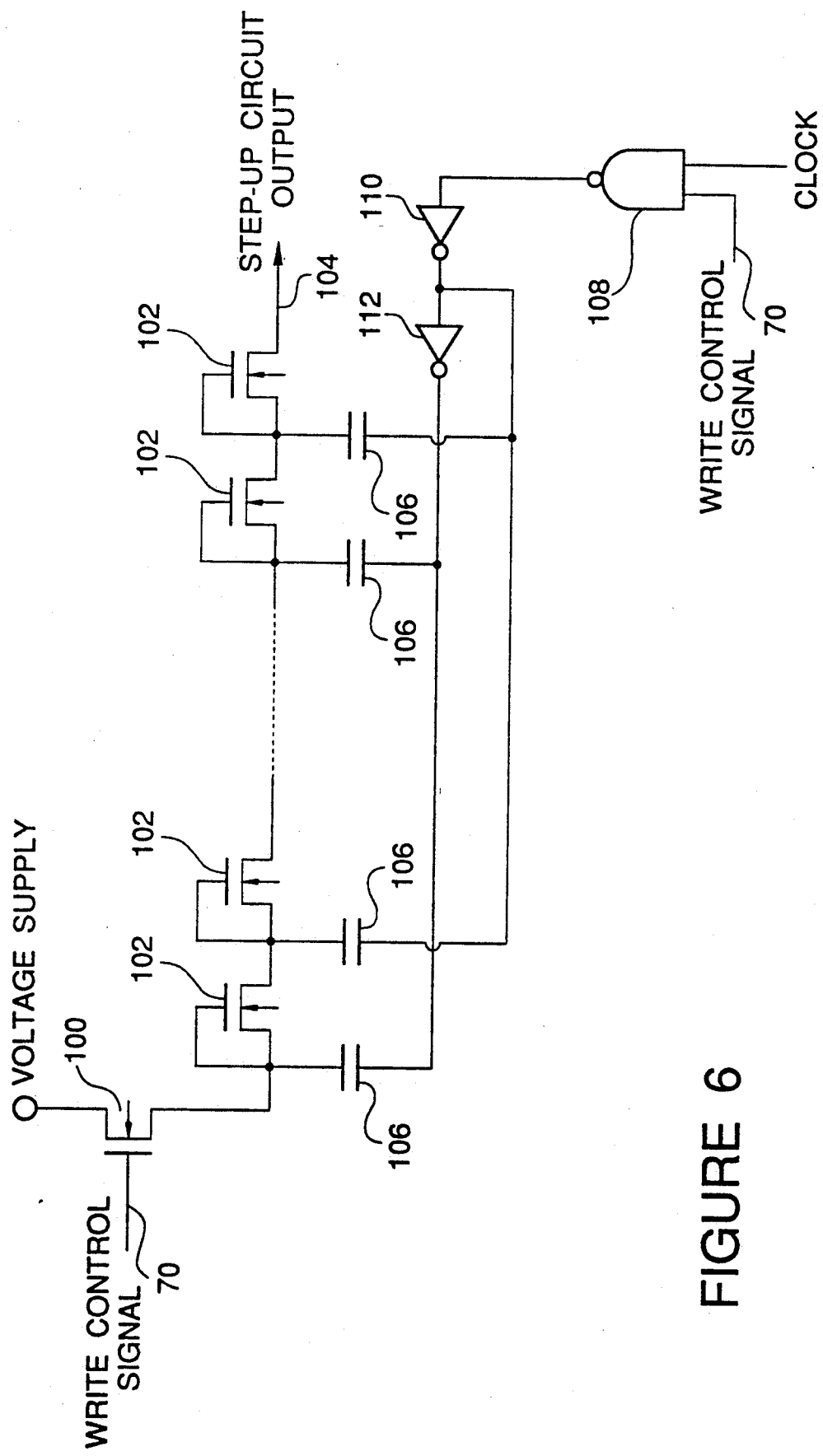
FIGS. 6 and 7 are circuit diagrams of the step-up circuit used in the test circuits shown in FIGS. 4 and 5.
Figure 7:
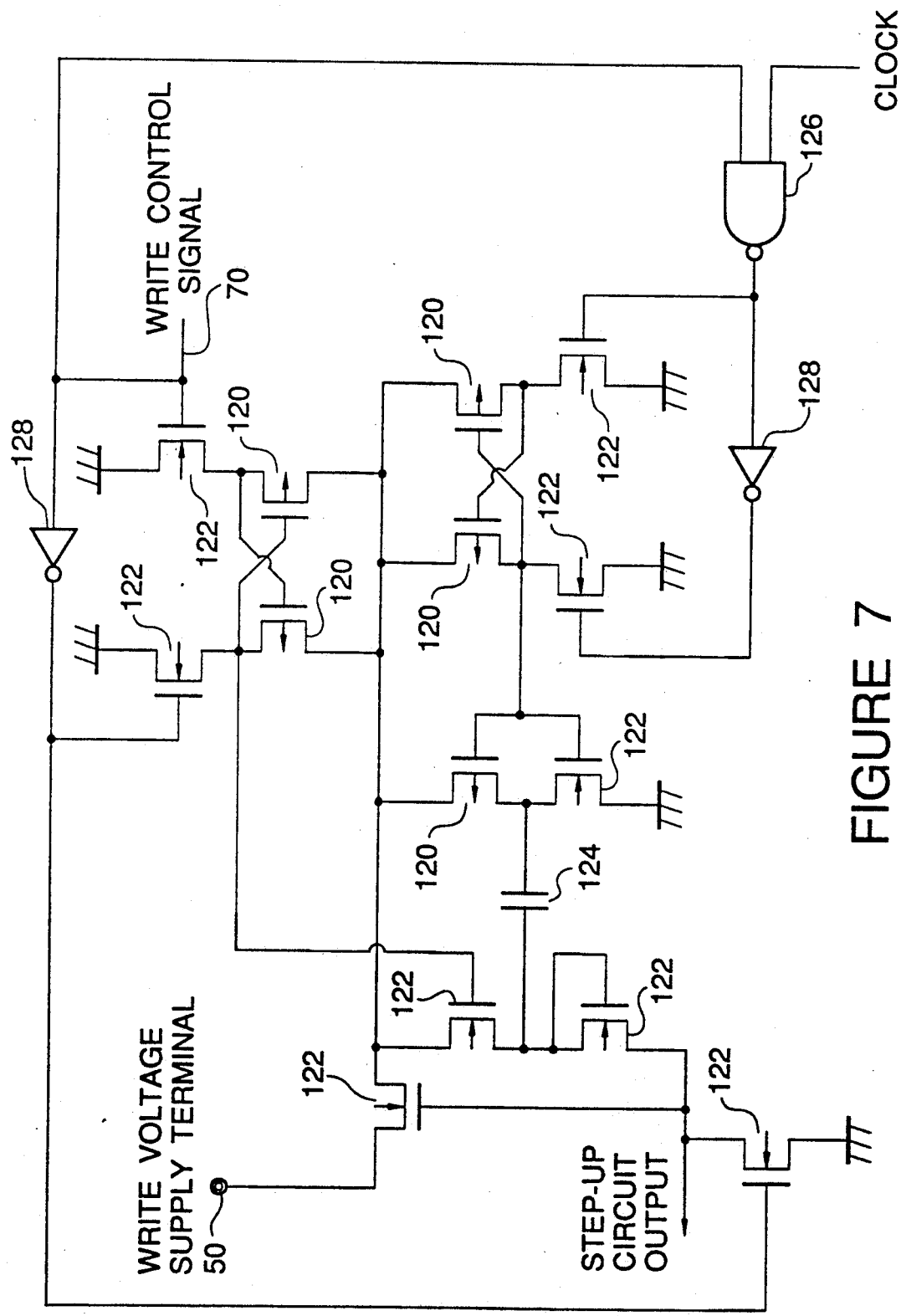

Referring to FIGS. 6 and 7, there are shown typical circuit diagrams of the step-up circuit used in the test circuits shown in FIGS. 4 and 5.

The step-up circuit shown in FIG. 6 includes an N-channel transistor 100 having a gate connected to receive the write control signal 70 and a drain connected to the normal power supply voltage. A source of the transistor 100 is connected to a plurality of series-connected N-channel transistors 102 to a step-up output terminal 104. Each of the transistor 102 has a gate connected to one end of its current path. A connection node between each pair of transistors 100 and 102 is connected to one electrode of a capacitor 106.

The step-up circuit shown in FIG. 6 also includes a NAND gate 108 connected to receive the write control signal 70 and a clock signal CLOCK. An output of the NAND gate 108 is connected to a NOT gate 110, whose output is connected to another NOT gate 112. The other electrodes of the capacitors 106 are alternatively connected to an output of the NOT gate 112 and the output of the NOT gate 110.

The step-up circuit shown in FIG. 7 is composed of a plurality of P-channel transistors 120, a plurality of N-channel transistors 122, a capacitor 124, an NAND gate 126 and two NOT gates 128 connected as shown.

The circuits shown in FIGS. 6 and 7 are well known to persons skilled in the art, a more detailed explanation of the construction and a description of an operation will be omitted.

Finally, a test method using the test circuit in accordance with the present invention will be explained. Each memory cell of the semiconductor memory device has a double gate structure including the control gate and the floating gate, and the semiconductor memory device includes the test circuit in accordance with the present invention. When the semiconductor memory device is read out, the test circuit can operate to selectively supply the control gate of the memory cells, through a write voltage supply line used when the semiconductor memory device is written, with a voltage which is supplied from a terminal different from a terminal of the normal voltage supply voltage used when the semiconductor memory device is read out, and which is higher than the normal voltage supply voltage. After completion of a wafer process for the semiconductor memory device including the test circuit in accordance with the present invention, ultraviolet light is irradiated to the semiconductor memory device so as to completely erase contents of the semiconductor memory device. Then, the semiconductor memory device is written, and a certain voltage is supplied to the control gate of the memory cells by the test circuit in accordance with the present invention in order to read out the content of the memory cells. Thereafter, the semiconductor memory device is put under a high temperature for a predetermined constant time, and then, a certain voltage is supplied to the control gate of the memory cells by the test circuit in accordance with the present invention in order to read out the content of the memory cells. The written state before the high temperature storage is compared with the written state after the high temperature storage.

The invention has thus been shown and described with reference to the specific embodiments. However, it should be noted that the present invention is in no way limited to the details of the illustrated structures but changes and modifications may be made within the scope of the appended claims.

I claim:
1. A semiconductor memory device comprising:
   a memory cell array composed of a plurality of memory cell transistors arranged in a plurality of rows and in a plurality of columns;
   means responsive to a row address so as to select one row of said plurality of rows;
   a voltage supply line;
   means for supplying a voltage on said voltage supply line to a control gate of memory cell transistors connected to a selected row;
   means for supplying a first voltage to said voltage supply line at the time of data reading;
   means for supplying a second voltage higher than said first voltage to said voltage supply line at the time of data writing; and
   means for supplying a third voltage higher than said first voltage but smaller than said second voltage to said voltage supply line at the time of testing a written condition of the memory cell transistor.

2. A semiconductor memory device as claimed in claim 1, and further comprising:
   a row decoder having a plurality of output lines coupled to said plurality of rows of said memory cell array;
   a column selection circuit connected to said plurality of columns of said memory cell array;
   a column decoder having a plurality of output lines coupled to said column selection circuit;
   means coupled to said column selection circuit and receiving said second voltage so as to supply said second voltage to a selected column of said plurality of columns; and
   a read/write circuit coupled to said column selection circuit and receiving said third voltage so as to supply said third voltage to a selected column of said plurality of columns.

3. A semiconductor memory device comprising:
   a memory cell array composed of a plurality of memory cell transistors arranged in a plurality of rows and in a plurality of columns;
   means responsive to a row address so as to select one row of said plurality of rows;
   a voltage supply line;

means for supplying a voltage on said voltage supply line to a control gate of memory cell transistors connected to a selected row;

means for supplying a first voltage to said voltage supply line at the time of data reading;

means for supplying a second voltage higher than said first voltage to said voltage supply line at the time of data writing;

means for supplying a third voltage higher than said first voltage but smaller than said second voltage to said voltage supply line at the time of testing a written condition of the memory cell transistor;

a row decoder having a plurality of output lines coupled to said plurality of rows of said memory cell array;

a column selection circuit connected to said plurality of columns of said memory cell array;

a column decoder having a plurality of output lines coupled to said column selection circuit;

means coupled to said column selection circuit and receiving said second voltage so as to supply said second voltage to a selected column of said plurality of columns; and a testing circuit which includes:

a write voltage terminal receiving a voltage used for data writing so as to supply a received voltage as said third voltage, a normal voltage terminal receiving a normal power supply voltage used for data reading, a test voltage supply terminal receiving a test voltage to be applied to a control gate of the memory cell transistor at the time of testing the memory cell transistor, a write voltage detection circuit connected to said write voltage terminal and operating to detect whether or not a write voltage is actually supplied to said write voltage terminal and to activate a write voltage detection signal when a voltage on said write voltage terminal is higher than said normal power supply voltage used for data reading, a first switching transistor connected between said write voltage terminal and a line for supplying said second voltage, said first switching transistor being controlled by a first set-up circuit so as to supply said second voltage when said first set-up circuit is activated by said activated write voltage detection signal, a second switching transistor connected between said normal voltage terminal and said line for supplying said second voltage and controlled by said write voltage detection signal so as to supply said normal power supply voltage to said line for supplying said second voltage when said write voltage detection signal is not activated, a third switching transistor connected between said write voltage terminal and a line for supplying said first voltage, said third switching transistor being controlled by a second set-up circuit so as to supply said second voltage when said second set-up circuit is activated by said write voltage detection signal, a fourth switching transistor connected between said voltage supply terminal and said line for supplying said first voltage, said fourth switching transistor being controlled by a third set-up circuit so as to supply said test voltage when said third set-up circuit is activated by a test control signal, and a fifth switching transistor connected between said normal voltage terminal and said line for supplying said first voltage, said fifth switching transistor being controlled by a gate circuit receiving said write voltage detection signal and said test control signal, so that said normal power supply voltage is supplied to said line for supplying said first voltage when both said write voltage detection signal and said test control signal are not activated.

4. A semiconductor memory device comprising:

a memory cell array composed of a plurality of memory cell transistors arranged in a plurality of rows and in a plurality of columns;

means responsive to a row address so as to select one row of said plurality of rows;

a voltage supply line;

means for supplying a voltage on said voltage supply line to a control gate of memory cell transistors connected to a selected row;

means for supplying a first voltage to said voltage supply line at the time of date reading;

means for supplying a second voltage higher than said first voltage to said voltage supply line at the time of data writing;

means for supplying a third voltage higher than said first voltage but smaller than said second voltage to said voltage supply line at the time of testing a written condition of the memory cell transistor;

a row decoder having a plurality of output lines coupled to said plurality of rows of said memory cell array;

a column selection circuit connected to said plurality of columns of said memory cell array;

a column decoder having a plurality of output lines coupled to said column selection circuit;

means coupled to said column selection circuit and receiving said second voltage to a selected column of said plurality of columns;

a read/write circuit coupled to said column selection circuit and receiving said third voltage so as to supply said third voltage to a selected column of said plurality of columns; and a testing circuit which includes:

a write voltage terminal receiving a voltage used for data writing so as to supply a received voltage as said third voltage, a normal voltage terminal receiving a normal power supply voltage used for data reading, a write voltage detection circuit connected to said write voltage terminal and operating to detect whether or not a write voltage is actually supplied to said write voltage terminal and to activate a write voltage detection signal when a voltage on said write voltage terminal is higher than said normal power supply voltage used for data reading, a first switching transistor connected between said write voltage terminal and a line for supplying said second voltage, said first switching transistor being controlled by a first set-up circuit so as to supply said second voltage when said first set-up circuit is activated by said activated write voltage detection signal, a second switching transistor connected between said normal voltage terminal and said line for supplying said second voltage and controlled by said write voltage detection signal so as to supply said normal power supply voltage to said line for supplying said second voltage when said write voltage detection signal is not activated, a third switching transistor connected between said write voltage terminal and a line for supplying said first voltage, said third switching transistor being controlled by a second set-up circuit which receives said write voltage detection signal and a test control signal, so that said voltage for data writing is supplied to said line for supplying said first voltage when one of said write voltage detection signal and said test control signal is activated, and a fourth switching transistor connected between said normal voltage terminal and said line for supplying said first voltage, said fourth switching transistor being controlled by a gate circuit receiving said write voltage detection signal and said test control signal, so that said normal power supply voltage is supplied to said line for supplying said first voltage when both said write voltage detection signal and said test control signal are not activated.

5. A semiconductor memory device as claimed in claim 4, wherein said testing circuit further includes:

a test voltage supply terminal receiving a test voltage to be applied to a control gate of the memory cell transistor at the time of testing the memory cell transistor; and a fifth switching transistor connected between said test voltage supply terminal and said line for supplying said first voltage, said fifth switching transistor being controlled by a third set-up circuit so as to supply said test voltage when said third set-up circuit is activated by said test control signal.

6. A semiconductor memory device comprising:

a memory cell array composed of a plurality of memory cell transistors arranged in a plurality of rows and in a plurality of columns;

means responsive to a row address so as to select one row of said plurality of rows;

a voltage supply line;

means for supplying a voltage on said voltage supply line to a control gate of memory cell transistors connected to a selected row;

means for supplying a first voltage onto said voltage supply line at the time of data reading;

means for supplying a second voltage higher than said voltage to said voltage supply line at the time of data writing;

means for supplying a third voltage higher than said first voltage but smaller than said second voltage to said voltage supply line at the time of testing a written condition of the memory cell transistor; and a testing circuit which includes:

a write voltage terminal receiving a writing voltage;

a normal voltage terminal receiving a normal power supply voltage used for data reading;

a write voltage detection circuit connected to said write voltage terminal and operating to detect whether or not the write voltage is actually supplied to said write voltage terminal and to activate a write voltage detection signal when a voltage on said write voltage terminal is higher than said normal power supply voltage used for data reading;

a first switching transistor connected between said write voltage terminal and said voltage supply line, said first switching transistor being controlled by a set-up circuit which receives said write voltage detection signal and a test control signal, so that said writing voltage is supplied to said voltage supply line when one of said write voltage detection signal and said test control signal is activated; and a second switching transistor connected between said normal voltage terminal and said voltage supply line, said second switching transistor being controlled by a gate circuit receiving said write voltage detection signal and said test control signal, so that said normal power supply voltage is supplied to said voltage supply line when at least one of said write voltage detection signal and said test control signal are not activated.

* * * * *